Figure 1:
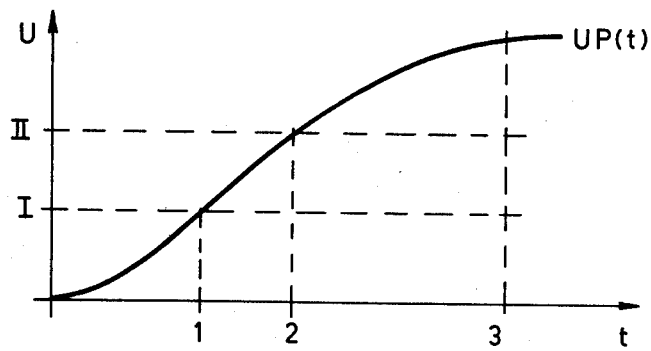

United States Patent [19]

Sickert

[11] 4,001,609
[45] Jan. 4, 1977

[54] CMOS POWER-ON RESET CIRCUIT
[75] Inventor: Klaus Sickert, Hamburg, Germany
[73] Assignee: U.S. Philips Corporation, New York, N.Y.
[22] Filed: June 30, 1975
[21] Appl. No.: 591,704
[30] Foreign Application Priority Data
  July 11, 1974  Germany .......................... 2433328
[52] U.S. Cl. ............................. 307/268; 307/246; 307/296; 328/48
[51] Int. Cl.$^2$ .................... H03K 5/01; H03K 1/00; H03K 5/153
[58] Field of Search .......... 307/279, 304, 296, 268, 307/246, 87; 328/48

[56] References Cited
UNITED STATES PATENTS

| | | | |
|---|---|---|---|
| 3,582,677 | 6/1971 | Perkins | 307/304 X |
| 3,895,239 | 7/1975 | Alaspa | 307/279 X |
| 3,911,289 | 10/1975 | Takemoto | 307/304 X |

OTHER PUBLICATIONS

Christopherson, "FET Hysteresis Circuit"; IBM Tech. Discl. Bull., vol. 15, No. 5, pp. 1475–1476; Oct. 1972.

Primary Examiner—John S. Heyman
Assistant Examiner—Larry N. Anagnos
Attorney, Agent, or Firm—Frank R. Trifari; Daniel R. McGlynn

[57] ABSTRACT

For each IC and adapted circuit is accommodated on the same semiconductor substrate in order to define a specific initial state of the circuit groups, which generally consist of flip-flops. The use of the invention ensures a high constancy over a wide temperature range. Moreover, the spread in the tolerances of the circuit elements is substantially eliminated.

1 Claim, 4 Drawing Figures

CMOS POWER-ON RESET CIRCUIT

The invention relates to an integrated circuit (IC) arrangement in complementary MOS-technology (CMOS), comprising circuit groups accommodated on the same semiconductor substrate and a control circuit which brings the circuit arrangement into a defined initial state when the common supply voltage is switched on. The control circuit recognizes two voltage values and derives a control signal therefrom, and transfers the control signal with a reset value for obtaining the defined initial state and subsequently an enable value for releasing the circuit groups.

The term "circuit groups" is to be understood to mean arrangements of flip-flops and gates, which at their inputs may have several connections and an their outputs supply defined signals, viz. either a logical "low" or a logical "high" signal. When the supply voltage for the circuit groups is applied, which groups are generally accommodated on a common semiconductor substrate, these individual circuit groups, in particular the individual flip-flops, may be in a specific state, which is unknown. However, in many cases such a circuit arrangement is required to automatically assume a predetermined state upon application of the supply voltage.

For solving said problem it is known to connect a to said IC, which essentially consists of a resistor in series with a capacitor, included between the supply voltage and the common reference point, i.e. generally ground. This circuit ensures that the relevant connection of the circuit arrangement follows the variation of the supply voltage with a delay. The delay is determined by the time constant of the resistor-capacitor combination and the rise time of the supply voltage, and is employed for the delayed release of the circuit arrangement.

Another known circuit arrangement distinguishes two fixed voltage values as the supply voltage increases, whilst it has been assumed that the supply voltage cannot be switched on abruptly but exhibits a certain voltage increase.

For the usual supply voltage a characteristic voltage value is for example attained after a time of 150 msecs, and a second characteristic voltage value after a time of 250 msecs, while the full supply voltage is not reached until after 500 msecs. The control circuit which recognizes these two above-mentioned voltage values, now derives a reset value from the first control signal, i.e. a defined voltage, generally the voltage 0, is applied to the clear connections of said circuit groups, so that the individual circuit groups, and thus the flip-flops therein, will assume an exactly defined initial state. However, as long as the clear signal is present, i.e. the reset value is at the clear connection, the flip-flop circuit is blocked, i.e. it cannot receive any signals at its input; hence, after this reset value it requires an enable value at the clear connection so as to enable the flip-flop or circuit groups to change over or operate respectively in the desired manner during the subsequent instants.

The drawback of the known circuit arrangements is that in the case of the first known solution to the problem it is generally not possible to accommodate such a circuit arrangement on the same crystal as the other circuit groups, because the required time constants cannot be realized economically in an integrated circuit. Moreover, the time constant of the circuitry should be adapted to the rise time of the supply voltage, because otherwise in a borderline case even the capacitor voltage can directly follow the supply voltage, so that defined values can no longer be attained. In the case of the second known circuit arrangement the problem is its critical dimensioning in particular with a view to the temperature dependence and spread in parameters associated with integrated circuits. As a result the two voltage values may deviate to such an extent that the second voltage value becomes even smaller than the above-mentioned first voltage value, so that it is obvious that the entire operation of the control circuit becomes unreliable. Therefore it is necessary in such circuit arrangements to adapt the temperature coefficients and the spread in parameters of the individual circuit elements to each other.

According to the invention this is achieved by the use of so-called enhancement-type MOS-transistors. It is known that MOS transistors are turned on at a specific threshold voltage. Said threshold voltage only depends on the manufacturing technology. Said voltage is therefore approximately the same for n-type MOS transistors as well as for p-type transistors on one crystal. These known facts form the basis for the present invention.

Furthermore, it is assumed that it is known that, in order to equalize the threshold voltages to a high degree, the elements of the control circuits are accommodated on the same crystal as the elements of the circuit groups.

In order to obtain a specific initial state for the circuit groups which are accommodated on the same crystal when the common supply voltage for an integrated circuit arrangement of the type mentioned in the preamble is switched on, the control circuit and the circuit groups, according to the invention, comprise enhancement-type MOS-transistors of p-type and the n-type conductivity, whose source and bulk connections are interconnected for each type and of which the p-type transistors have a threshold voltage value U1 and of which the n-type transistors have a threshold voltage value U2, and the control circuit is designed so that the magnitude of the first voltage value equals the greater of the two threshold voltage values U1 and U2 and the magnitude of the second voltage value equals the sum of the threshold voltage values U1 + U2.

Thus, the first feature of the present invention is that the control circuit and circuit groups consist of MOS-transistors. The second step for distinguishing the supply voltage, is to introduce a defined value, namely the value at which the MOS-transistors are definitely turned on. When n-type and p-type MOS-transistors are accommodated on the same crystal, the transistors of the one type will definitely have a higher threshold voltage than those of the other type. Therefore, when in such a circuit arrangement each transistor is to be turned on with certainty, the greater of these two voltage values must be selected, while moreover the circuit arrangement must be designed so that said greater of the two threshold voltages is also used with a defined value for distinguishing the supply voltage. Said first threshold voltage value serves for distinguishing the supply voltage, and the magnitude of the second voltage value, as stated hereinbefore in the preamble, is now defined by the circuit arrangement in such a way that it equals the sum of the threshold voltages U1 + U2, i.e. the sum of the threshold voltages of the p-type and of the n-type transistors.

The operation of the invention will now be described in more detail with reference to the Figures.

Figure 2:
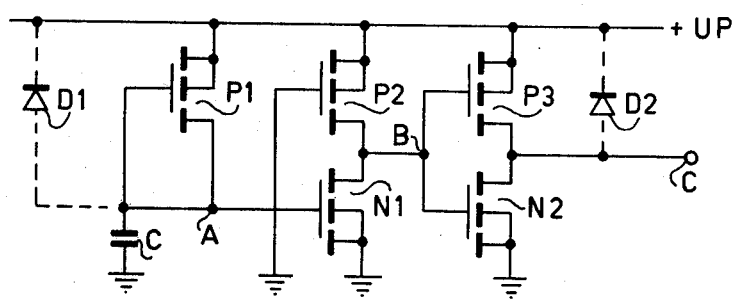
Figure 3:
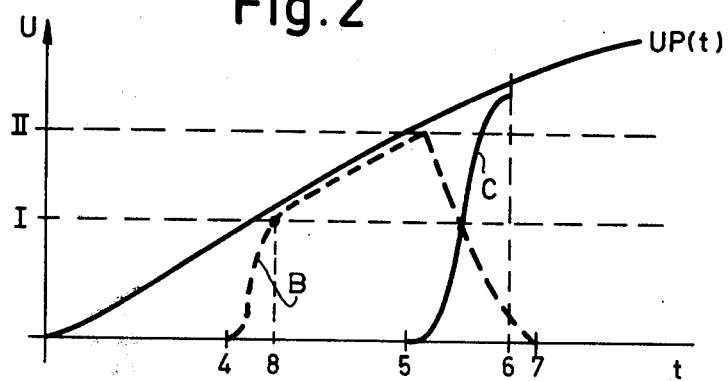
Figure 4:
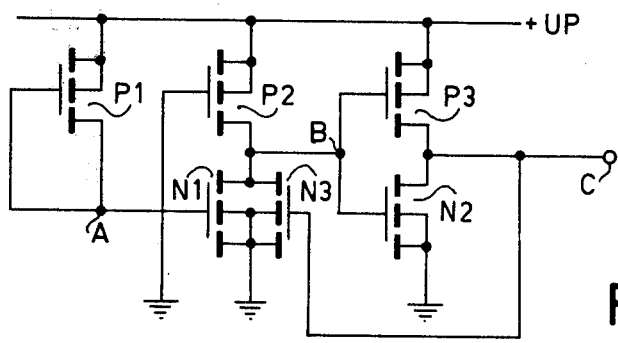

FIG. 1 is a graph of the supply voltage variation as a function of the time $t$, FIG. 2 shows the circuit diagram of a start-reset circuit, FIG. 3 shows the voltage variation of the supply voltage UP and of the voltages at the various points in the circuit arrangement as a function of time $t$, and FIG. 4 shows an improved circuit arrangement of the circuit of FIG. 2, in which a feedback is introduced.

For describing and explaining the invention we to refer to FIGS. 1, 2 and 3. It is assumed that the supply voltage UP initially has a value of 0 V. This is the beginning of the characteristic for $UP = f(t)$ in FIG. 1. At this instant all MOS transistors of the control circuit in FIG. 2 are cut off, because no voltages are present. When the supply voltage UP now slowly increases towards positive values, the p-type MOS-transistor P2 is turned on first, because its gate connection is connected to the common reference point, i.e. ground, and its source and bulking connections are connected to the supply voltage. Said MOS-transistor P2 further operates merely as a resistor and now first connects point B of the circuit to the supply voltage at the instant 1 in FIG. 1 and at the instant 4 in FIG. 3, and point B of the circuit now comparatively soon adopts the value of the supply voltage UP. Consequently, this is the instant at which the circuit recognizes the first voltage value, which is denoted by I in FIG. 1 and in FIG. 3. When the supply voltage now increases further, point B of the circuit, because the transistor P2 is conducting, will follow said supply voltage until the second voltage value is reached, which in FIG. 1 and FIG. 3 is denoted by II. This corresponds to the instant 5 in FIG. 3 and to the instant 2 in FIG. 1. Said second voltage value will be further discussed hereinafter, because in the mean time other processes take place. Via the parasitic capacitance C the gate of the p-type MOS-transistor P1 is also connected to ground potential, because all other capacitances are negligibly small, and is turned on at practically the same instant as the transistor P2. As the junction A is only loaded by the comparatively low parasitic capacitance C, it directly follows the supply voltage with a voltage difference which corresponds to the magnitude of the threshold voltage of the transistor P1, and finally at the instant 5, reaches a value which corresponds to the threshold voltage for the n-type MOS-transistor N1. At this threshold voltage value the transistor N1, which is the active transistor of an inverter with a passive load P2 becomes conductive. By a suitable dimensioning, i.e. a high resistance ratio between the load transistor P2 and the active transistor N1, it suffices when the threshold voltage of N1 is slightly exceeded at the instant of the second voltage value II for turning on the inverter (P2–N1). At said instant, which is denoted by 5 in FIG. 3, the voltage at point B of the circuit is connected to the common reference point and now assumes this value after a specific time, which in FIG. 3 is denoted by the instant 7. At the instant of the second voltage value II, i.e. at the instant 5, it is thus established that the supply voltage exactly equals the sum of the threshold voltage for the transistor N1 and the threshold voltage for the transistor P1. Said voltage value is consequently accurately defined in respect of its absolute magnitude.

The voltage at the point C of the circuit arrangement of FIG. 2 is now first 0 V, as appears from FIG. 3, since the supply voltage is also 0 V. This voltage remains substantially below the voltage I, and when point B of the circuit ultimately follows the supply voltage, it finally reaches a value which approximates I. This takes place very rapidly since the gate of the n-type MOS transistor N2 becomes positive so that the transistor is turned on. Only then point C of the circuit is actually held at ground potential, i.e. at 0 V, until finally the value is reached at which the transistor N1 is turned on. This is at the instant 5 in FIG. 3, and at said instant B has reached the second voltage value II, while A has reached the value I. Point B of the circuit arrangement is then connected to O and this means that the gate of the p-type MOS-transistor P3 is connected to earth potential, after which said transistor is turned on, the supply voltage, i.e. an accurately defined supply voltage, now being applied to point C of the circuit arrangement. The potential at C consequently follows a characteristic in accordance with FIG. 3, from 0 V at the instant 5 to UP. The potential has approximately reached this value of UP at the instant 6.

When the total supply voltage is switched off again, the original values will be attained after a specific time. This time is reduced in the present circuit arrangement, since the diodes D1 and D2 of the drain bulk junction are employed so as to avoid the situation whereby points A and C of the circuit, and thus point B, would become more positive than the forward voltage of the diodes D1 and D2 after the supply voltage UP has been switched off.

The operation of the circuit arrangement is now as follows: When the control circuit of FIG. 2 is accommodated on the same crystal as the circuit groups, which may consist of flip-flops, the value of the common reference potential, i.e. the value of the earth potential or 0 V is maintained at the clear connection, when a supply voltage UP is switched on via point C of the circuit, which is connected to the clear connections of the flip-flop circuit. This is the so-called reset and as long as this value of 0 V is maintained at the clear connections and at point C of the circuit respectively, the flip-flop circuit groups cannot operate. The release or the enable value respectively occurs when point C of the circuit arrangement of FIG. 2 has assumed the value of the supply voltage. This would consequently be the case at the instant 6 in FIG. 3. The flip-flop circuits and thus the circuit groups in the same IC are then released again after being forced into a defined initial state.

FIG. 4 shows a further improvement of the circuit arrangement of FIG. 2. For convenience the parasitic capacitance C and the diodes D1 and D2 are not shown. This circuit arrangement also includes an additional n-type MOS transistor N3. The N3 transistor is connected to the MOS transistor N1, in such a way that each time the source connections, the drain connections and the substrate connections are interconnected, while the gate connection of the N3 transistor is connected to the output, (i.e. to the line which leads to point C of the circuit) so that the circuit substantially operates with a feedback line. Hence, transistor N3 may be termed a feedback transistor. When this feedback and this transistor are introduced, the circuit arrangement will operate as a Schmitt trigger, and the rise time of the potential at point C (see FIG. 3) is decreased and thus becomes substantially more independent of the rate of change, i.e. the rise time, of the supply voltage UP.

The circuit arrangements shown are exclusively voltage controlled and therefore their operation is independent of the rate of change of the supply voltage, except for a very small value, for which allowance is to be made owing to the finite response time of the MOS transistors and of the complete integrated circuit arrangement. While in the known voltage-controlled circuit arrangements the Schmitt-triggers had to operate with two fixed voltage values, which were dependent on the temperature and spread in parameters and which could even overlap, the use of the invention ensures that the switching points are now dictated only by the threshold voltages of the p-type and n-type MOS-transistors. When the other circuits accommodated on the same crystal also embody complementary MOS technology, the present circuit arrangement has been adapted in an optimum manner to the behaviour of the further circuitry owing to the fixed relationship of the switching points to the threshold voltages of the MOS-transistors, so that the reliable operation may be guaranteed independent of the temperature and the spread in parameters.

What is claimed is:

1. An automatic reset circuit, comprising
a common power supply line;
an output terminal;
a first enhancement mode p-type MOSFET having a first electrode connected to said common power supply line, a second electrode, and a gate connected to said second electrode of said first MOSFET;
a second enhancement mode p-type MOSFET having a first electrode connected to said common power supply line, a second electrode, and a gate connected to ground;
a third enhancement mode p-type MOSFET having a first electrode connected to said common power supply line, a second electrode, and a gate connected to said second electrode of said second MOSFET;
a fourth enhancement mode n-type MOSFET having a first electrode connected to said second electrode of said second MOSFET, a second electrode connected to ground, and a gate connected to said gate of said first MOSFET;
a fifth enhancement mode n-type MOSFET having a first electrode connected to said second electrode of said third MOSFET and to said output terminal for providing a predetermined voltage level upon activation of said common power supply line, a second electrode connected to ground, and a gate connected to said gate of said third MOSFET; and
a diode connected between said common power supply line and said output terminal.

* * * * *